United States Patent
Ko

(10) Patent No.: US 8,929,156 B2
(45) Date of Patent: Jan. 6, 2015

(54) SYSTEM-IN PACKAGE INCLUDING SEMICONDUCTOR MEMORY DEVICE AND METHOD FOR DETERMINING INPUT/OUTPUT PINS OF SYSTEM-IN PACKAGE

(75) Inventor: Bok Rim Ko, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 369 days.

(21) Appl. No.: 13/336,933

(22) Filed: Dec. 23, 2011

(65) Prior Publication Data

US 2013/0033942 A1 Feb. 7, 2013

(30) Foreign Application Priority Data

Aug. 4, 2011 (KR) .................. 10-2011-0077890

(51) Int. Cl.
*G11C 7/10* (2006.01)
*G11C 7/22* (2006.01)
*G11C 29/12* (2006.01)

(52) U.S. Cl.
CPC .......... *G11C 7/222* (2013.01); *G11C 29/12015* (2013.01)
USPC ................... 365/189.05; 365/201; 365/233.1; 365/233.11; 365/233.12; 365/236

(58) Field of Classification Search
CPC ........ G11C 29/14; G11C 29/50; G11C 29/12; G11C 7/00; G11C 7/22; G11C 7/222; G11C 7/1072; G11C 11/401
USPC .................... 365/189.05, 201, 233.1, 233.11, 365/233.12, 236
See application file for complete search history.

(56) References Cited

U.S. PATENT DOCUMENTS

| 6,456,561 | B2 * | 9/2002 | Maeda ................. 365/189.05 |
| 6,489,819 | B1 * | 12/2002 | Kono et al. ................. 327/141 |
| 2002/0152439 | A1 | 10/2002 | Kim et al. |
| 2005/0152190 | A1 * | 7/2005 | Fukuda ................. 365/189.05 |

* cited by examiner

*Primary Examiner* — Thao H Bui
(74) *Attorney, Agent, or Firm* — William Park & Associates Patent Ltd.

(57) ABSTRACT

A semiconductor memory device includes an internal clock generation unit configured to generate an internal clock including periodic pulses during a period of a test mode; a DQ information signal generation block configured to generate DQ information signals which are sequentially enabled, in response to the internal clock; and a data output block configured to output the DQ information signals to DQ pads during a period of the test mode.

22 Claims, 8 Drawing Sheets

SYSTEM-IN PACKAGE INCLUDING SEMICONDUCTOR MEMORY DEVICE AND METHOD FOR DETERMINING INPUT/OUTPUT PINS OF SYSTEM-IN PACKAGE

CROSS-REFERENCES TO RELATED APPLICATIONS

The present application claims priority under 35 U.S.C 119(a) to Korean Application No. 10-2011-0077890, filed on Aug. 4, 2011, in the Korean Intellectual Property Office, which is incorporated herein by reference in its entirety.

BACKGROUND

With the development of technologies and trend toward high integration and high speed operation, semiconductor memory devices are used by being mounted to various products ranging from large-sized electronic home appliances to small-sized mobile products.

Semiconductor memory devices are provided to final consumers in the form of packages. Various package structures have been suggested according to the physical structures and arrangements of input/output pins connecting the insides and the outsides of chips among various factors of packages. Also, in order to realize the miniaturization of a product, the size of the semiconductor memory device has been decreased through high integration of a semiconductor memory chip and a package of the semiconductor memory chips. Recently, as a way of highly integrating a package, various packages such as a multi-chip package and a system-in package are being developed.

The multi-chip package and the system-in package are realized by integrating a plurality of semiconductor memory chip dies on a substrate in a package. In particular, in the system-in package, a memory chip and a specialized processor for controlling the memory chip are packaged together.

However, if information regarding connection configurations between the DQ pads of a semiconductor memory device and the input/output pins of a system-in package, through which data are inputted and outputted, is not shared between a manufacturer of the system-in package and a manufacturer of the semiconductor memory device, it is difficult for the manufacturer of the semiconductor memory device to perform a test and a failure analysis for a product used in the system-in package.

SUMMARY

Embodiments of the present invention relate to a system-in package including a semiconductor memory device and a method for determining input/output pins of a system-in package, which can output preset levels in the sequence of DQ pads when a test mode is entered and can determine connection configurations between DQ pads of a semiconductor memory device and input/output pins of a system-in package by sensing the levels of the input/output pins of the system-in package connected with the DQ pads.

In an embodiment, a semiconductor memory device includes: an internal clock generation unit configured to generate an internal clock including periodic pulses when a test mode is entered; a DQ information signal generation block configured to generate DQ information signals which are sequentially enabled, in response to the internal clock; and a data output block configured to output the DQ information signals to DQ pads when the test mode is entered.

In an embodiment, a system-in package includes: a DQ information signal generation block configured to generate DQ information signals which are sequentially enabled when a test mode is enabled; a data output block configured to output the DQ information signals to DQ pads during the test mode; and a package pad unit connected with the DQ pads through bonding.

In an embodiment, a method for determining input/output pins of a system-in package includes: generating an internal clock which includes periodic pulses, in response to a test mode signal; generating DQ information signals which are sequentially enabled, in response to the internal clock; and outputting the DQ information signals to input/output pins of a system-in package through DQ pads.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
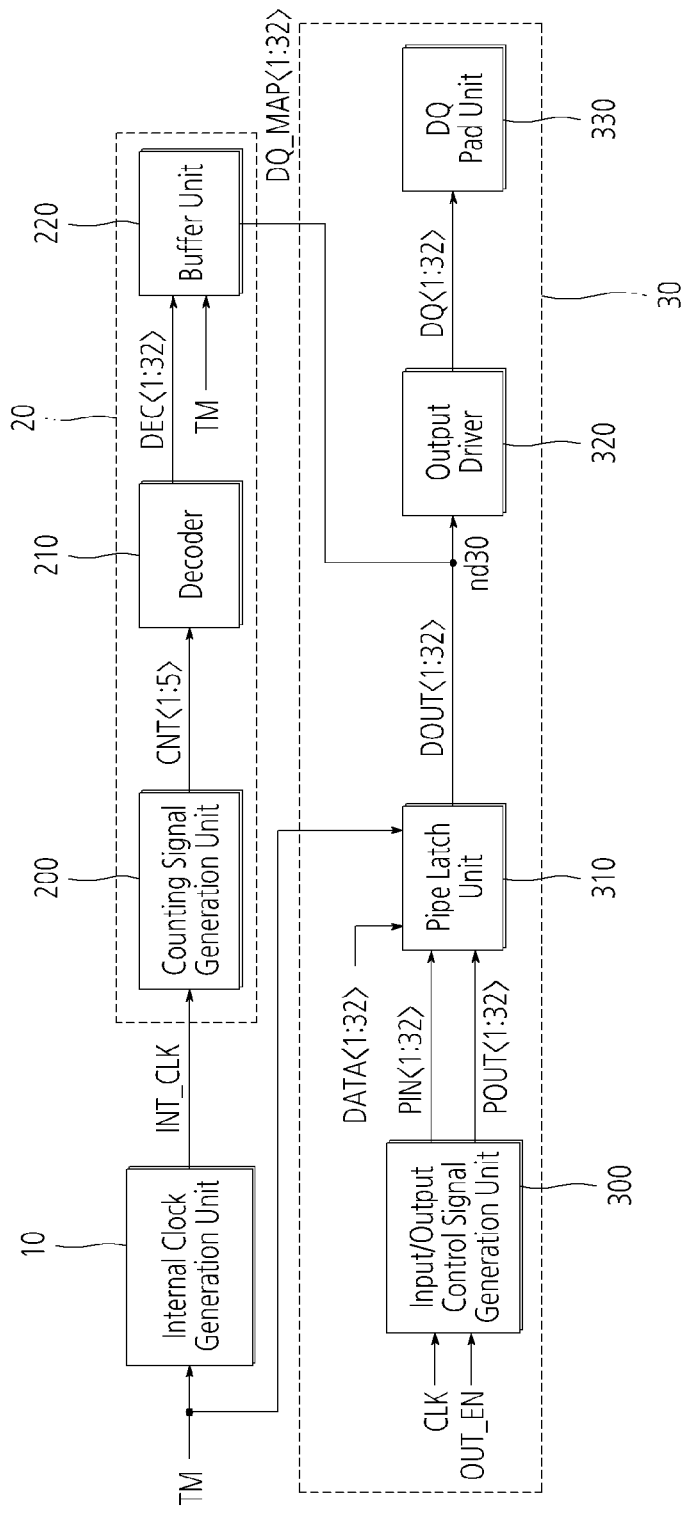
FIG. 1 is a block diagram showing a semiconductor memory device in accordance with an embodiment of the present invention.

FIG. 1 is a block diagram showing a semiconductor memory device in accordance with an embodiment of the present invention.

Referring to FIG. 1, a semiconductor memory device in accordance with an embodiment of the present invention includes an internal clock generation unit 10, a DQ information signal generation block 20, and a data output block 30. The internal clock generation unit 10 is configured to generate an internal clock INT_CLK, which includes periodic pulses, in response to a read command READ when a test mode is entered. The DQ information signal generation block 20 is configured to generate DQ information signals DQ_MAP<1:32> which are sequentially enabled, in response to the internal clock INT_CLK. The data output block 30 is configured to output the DQ information signals DQ_MAP<1:32> to DQ pads DQ<1:32> when the test mode is entered, and output output data DOUT<1:32> outputted from memory cells to the DQ pads DQ<1:32> when the test mode is exited.

Figure 2:
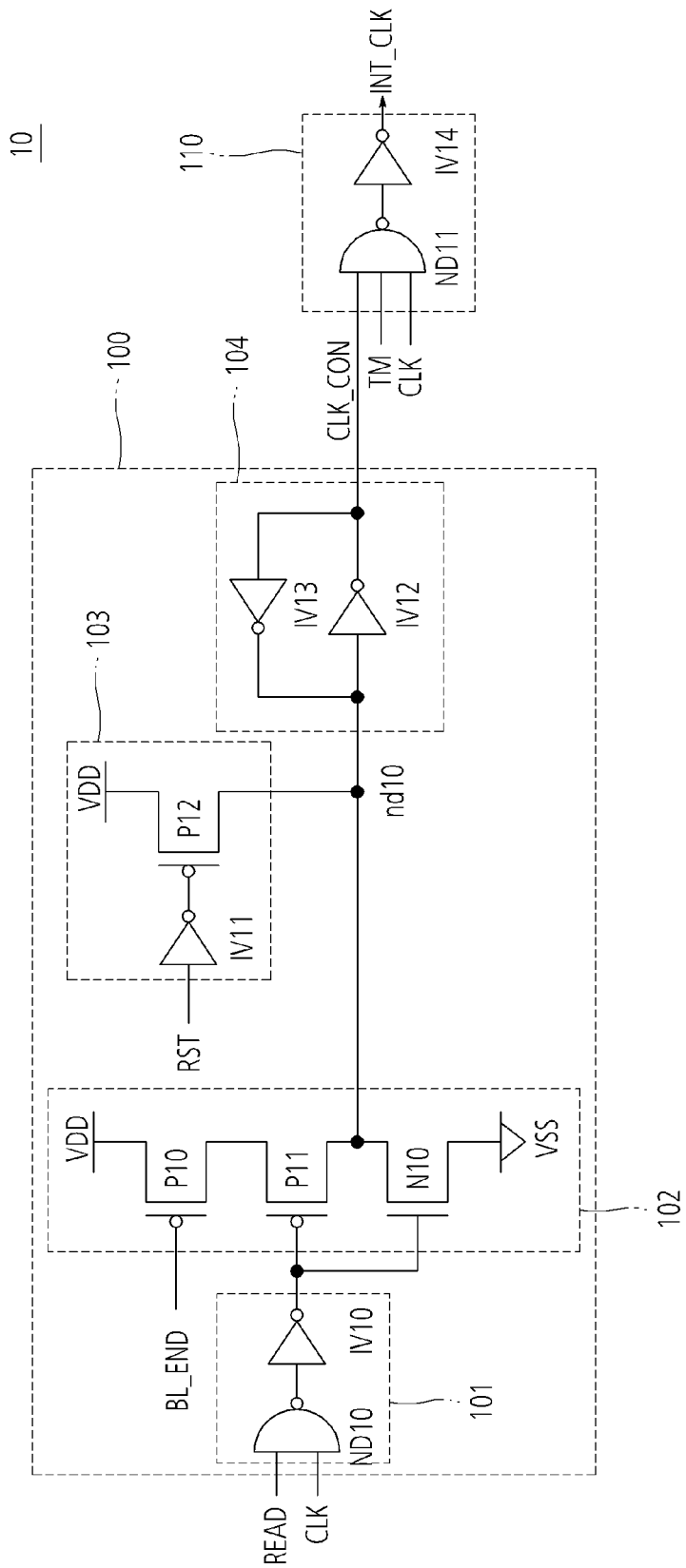
FIG. 2 is a circuit diagram of the internal clock generation unit shown in FIG. 1.

Referring to FIG. 2, the internal clock generation unit 10 includes a clock control signal generating section 100 and a clock generating section 110.

The clock control signal generating section 100, according to an example, includes a logic stage 101, a driving stage 102, a reset stage 103 and a latch stage 104. The logic stage 101 may be constituted by a NAND gate ND10 which receives the read command READ and an external clock CLK and performs an ANDing operation and an inverter IV10. The driving stage 102 may be constituted by transistors P10, P11 and N10 which drive a node nd10 in response to the output signal of the logic stage 101 and a burst length end signal BL_END. The reset stage 103 may be constituted by an inverter IV11 which inverts a reset signal RST and a transistor P12 which pull-up drives the node nd10 in response to the output signal of the inverter IV11. The latch stage 104 may be constituted by inverters IV12 and IV13 which latch the signal of the node nd10 and output a clock control signal CLK_CON. Here, the burst length end signal BL_END is a signal, which is enabled at a time when data is outputted after a read operation and is set in a mode register set (MRS). The reset signal RST is a signal which is enabled after a power-up period in which a power supply voltage VDD used by the semiconductor memory device is set to a predetermined level.

The clock generating section 110 may be constituted by a NAND gate ND11 and an inverter IV14 which perform an ANDing operation on the clock control signal CLK_CON, the external clock CLK and a test mode signal TM and generate the internal clock INT_CLK including periodic pulses.

Figure 3:
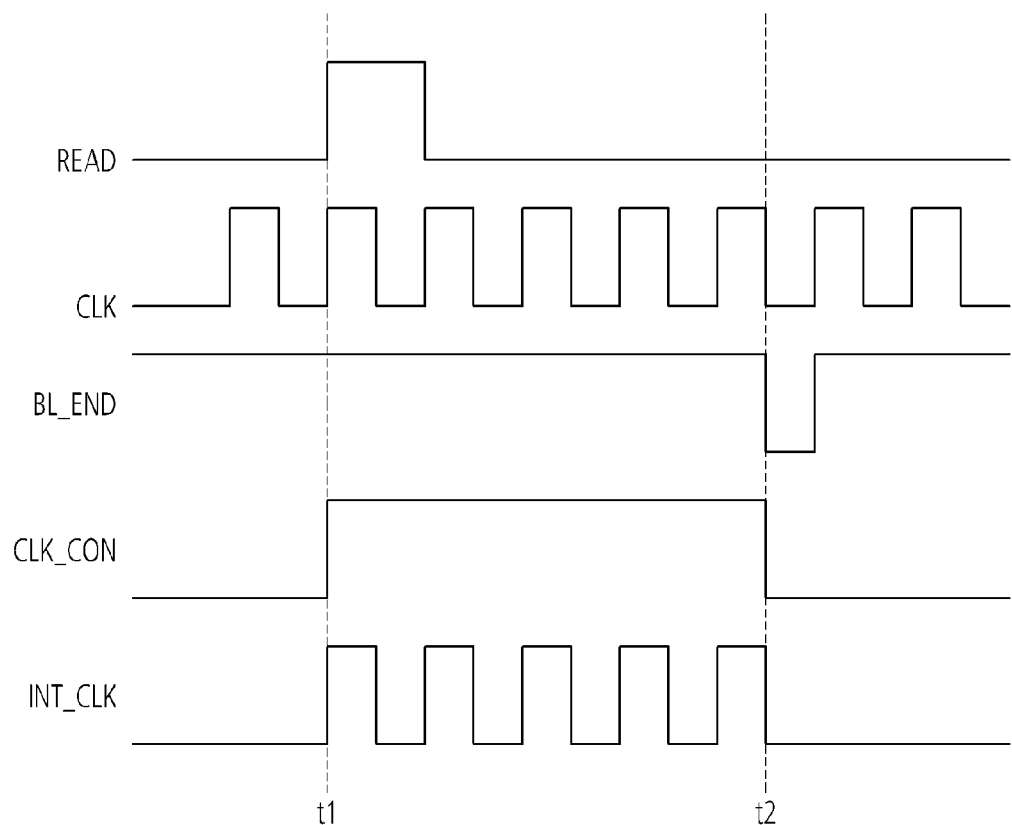
FIG. 3 is a waveform diagram showing input/output waveforms of the internal clock generation unit shown in FIG. 2.

In detail, a period in which the internal clock INT_CLK is generated will be described with reference to FIG. 3.

First, the reset stage 103 pull-up drives the node nd10 in response to the reset signal RST which is enabled for a certain period after the power-up period in which the power supply voltage VDD used by the semiconductor memory device is set to the predetermined level, and thereby, disables the internal clock INT_CLK.

Next, the logic stage 101 performs the ANDing operation on the read command READ and the external clock CLK, and outputs the output signal of a logic high level at a time t1. The driving stage 102 pull-down drives the node nd10 in response to the output signal of the logic high level outputted from the logic stage 101. The latch stage 104 latches the signal of the node nd10 and generates the clock control signal CLK_CON with a logic high level. The clock generating section 110 performs the ANDing operation on the clock control signal CLK_CON with the logic high level, the test mode signal TM enabled to a logic high level and the external clock CLK, and generates the internal clock INT_CLK which includes periodic pulses.

At a time t2, when the burst length end signal BL_END is enabled to a logic low level while an output signal of the logic stage 101 has a low level, the driving stage 102 pull-up drives the node nd10 to a logic high level. The latch stage 104 latches the signal of the node nd10 and generates the clock control signal CLK_CON with a logic low level. The clock generating section 110 performs the ANDing operation on the clock control signal CLK_CON with the logic low level, the test mode signal TM enabled to the logic high level and the external clock CLK, and disables the internal clock INT_CLK to a logic low level.

In this way, the internal clock INT_CLK has the logic low level after the power-up period when the test mode is entered, and is generated as periodic pulses when the read command READ is inputted at the time t1. Then, when the burst length end signal BL_END is inputted at the time t2, the internal clock INT_CLK is disabled to the logic low level.

The DQ information signal generation block 20, according to an example, includes a counting signal generation unit 200, a decoder 210, and a buffer unit 220.

Figure 4:
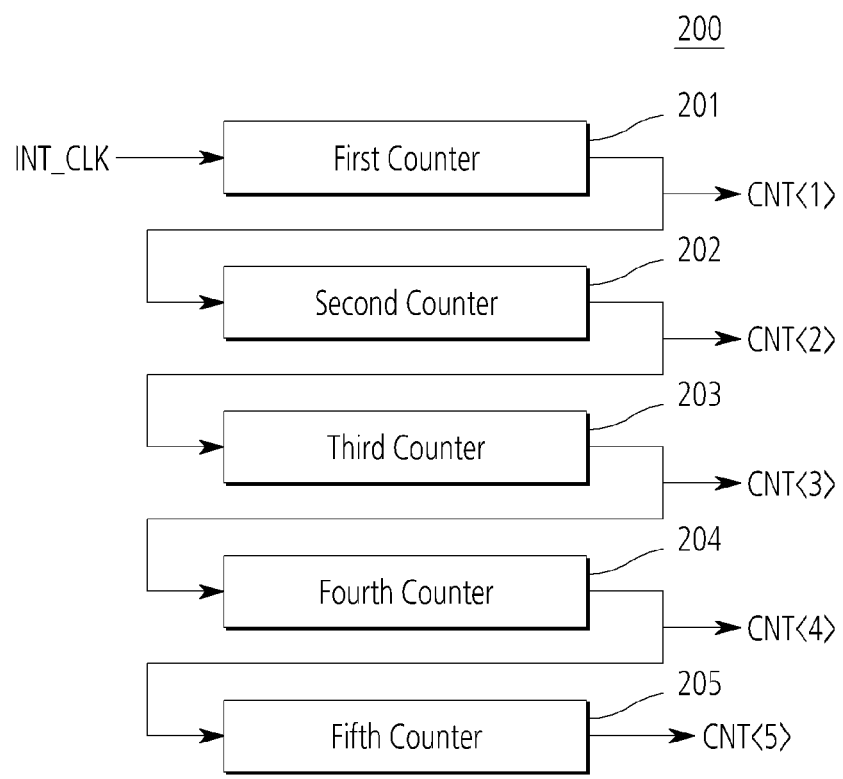
FIG. 4 is a block diagram of the counting signal generation unit shown in FIG. 1.

Referring to FIG. 4, the counting signal generation unit 200, according to an example, includes a first counter 201 configured to output a first counting signal CNT<1> in response to the internal clock INT_CLK, a second counter 202 configured to output a second counting signal CNT<2> in response to the first counting signal CNT<1>, a third counter 203 configured to output a third counting signal CNT<3> in response to the second counting signal CNT<2>, a fourth counter 204 configured to output a fourth counting signal CNT<4> in response to the third counting signal CNT<3>, and a fifth counter 205 configured to output a fifth counting signal CNT<5> in response to the fourth counting signal CNT<4>. The counting signal generation unit 200 do not perform a count operation to output the first to fifth counting signals CNT<1:5> when the reset signal RST has, for example, a high level.

Figure 5:
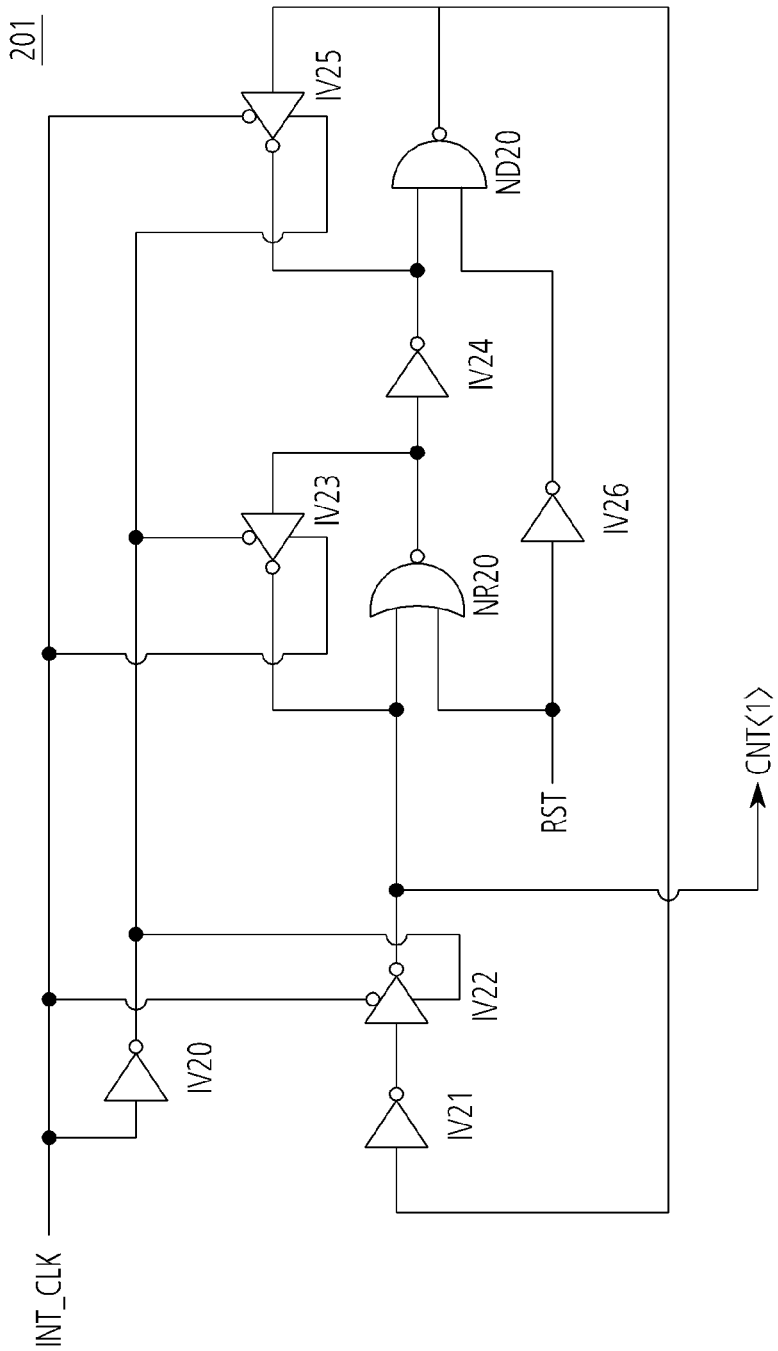
FIG. 5 is a circuit diagram of the first counter shown in FIG. 4.

In detail, referring to FIG. 5, the first counter 201 includes an inverter IV20 which inverts the internal clock INT_CLK, inverters IV21 to IV25 for outputting the first counting signal CNT<1> in response to the internal clock INT_CLK and the output signal of the inverter IV20, a NOR gate NR20, and a NAND gate ND20. The first counter 201 does not toggle the first counting signal CNT<1> according to the reset signal RST and the output signal of an inverter IV26 which inverts the reset signal RST, in the power-up period.

Since the second counter 202 may be configured in the same way as the first counter 201 and outputs the second counting signal CNT<2> in response to the first counting signal CNT<1>, the third counter 203 may be configured in the same way as the first counter 201 and outputs the third counting signal CNT<3> in response to the second counting signal CNT<2>, the fourth counter 204 may be configured in the same way as the first counter 201 and outputs the fourth counting signal CNT<4> in response to the third counting signal CNT<3>, and the fifth counter 205 may be configured in the same way as the first counter 201 and outputs the fifth counting signal CNT<5> in response to the fourth counting signal CNT<4>, detailed descriptions of the second to fifth counters 202 to 205 will be omitted herein.

The decoder 210 is configured to decode the first to fifth counting signals CNT<1:5> and generate first to thirty-second decoding signals DEC<1:32> which are sequentially enabled.

Figure 6:
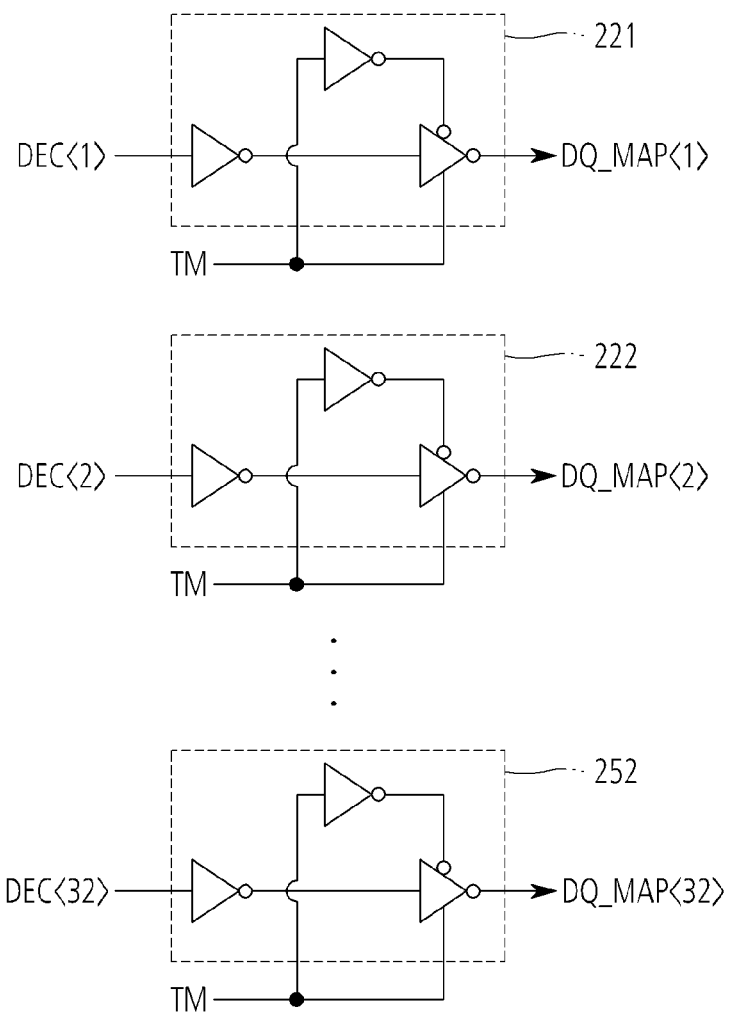
FIG. 6 is a circuit diagram of the buffer unit shown in FIG. 1.

Referring to FIG. 6, the buffer unit 220 includes first to thirty-second buffers 221 to 252 configured to buffer the first to thirty-second decoding signals DEC<1:32> in response to the test mode signal TM and generate first to thirty-second DQ information signals DQ_MAP<1:32>. The first to thirty-second buffers 221 to 252 output the first to thirty-second DQ information signals DQ_MAP<1:32> to a node nd30.

The data output block 30 includes an input/output control signal generation unit 300, a pipe latch unit 310, an output driver 320, and a DQ pad unit 330.

Referring to FIG. 1, the input/output control signal generation unit 300 is configured to receive an output enable signal OUT_EN and the external clock CLK and generate first to thirty-second input control signals PIN<1:32> and first to thirty-second output control signals POUT<1:32>. The output enable signal OUT_EN is a signal which is enabled from a time when a read operation is entered after the read command READ is inputted to a time when the data of memory cells are outputted to an outside.

The pipe latch unit 310 is configured to latch first to thirty-second data DATA<1:32> stored in the memory cells in response to the first to thirty-second input control signals PIN<1:32> when the test mode is exited, e.g., during a read operation period, and output the latched data DATA<1:32> to the node nd30 as first to thirty-second output data DOUT<1:32> in response to the first to thirty-second output control signals POUT<1:32>.

The output driver 320 is configured to output the first to thirty-second DQ information signals DQ_MAP<1:32> transferred to the node nd30, to the first to thirty-second pads DQ<1:32> of the DQ pad unit 330 during the test mode, and output the first to thirty-second output data DOUT<1:32> transferred to the node nd30, to the first to thirty-second pads DQ<1:32> of the DQ pad unit 330 when the test mode is exited, e.g., during a read operation period.

The DQ pad unit 330 is configured to output the signals of the first to thirty-second pads DQ<1:32> to first to thirty-second pads which are connected with the input/output pins of a system-in package.

The connection configurations between the DQ pads of the semiconductor memory device in accordance with an embodiment of the present invention and the pads of the system-in package will be described below with reference to FIGS. 7 and 8.

Figure 7:
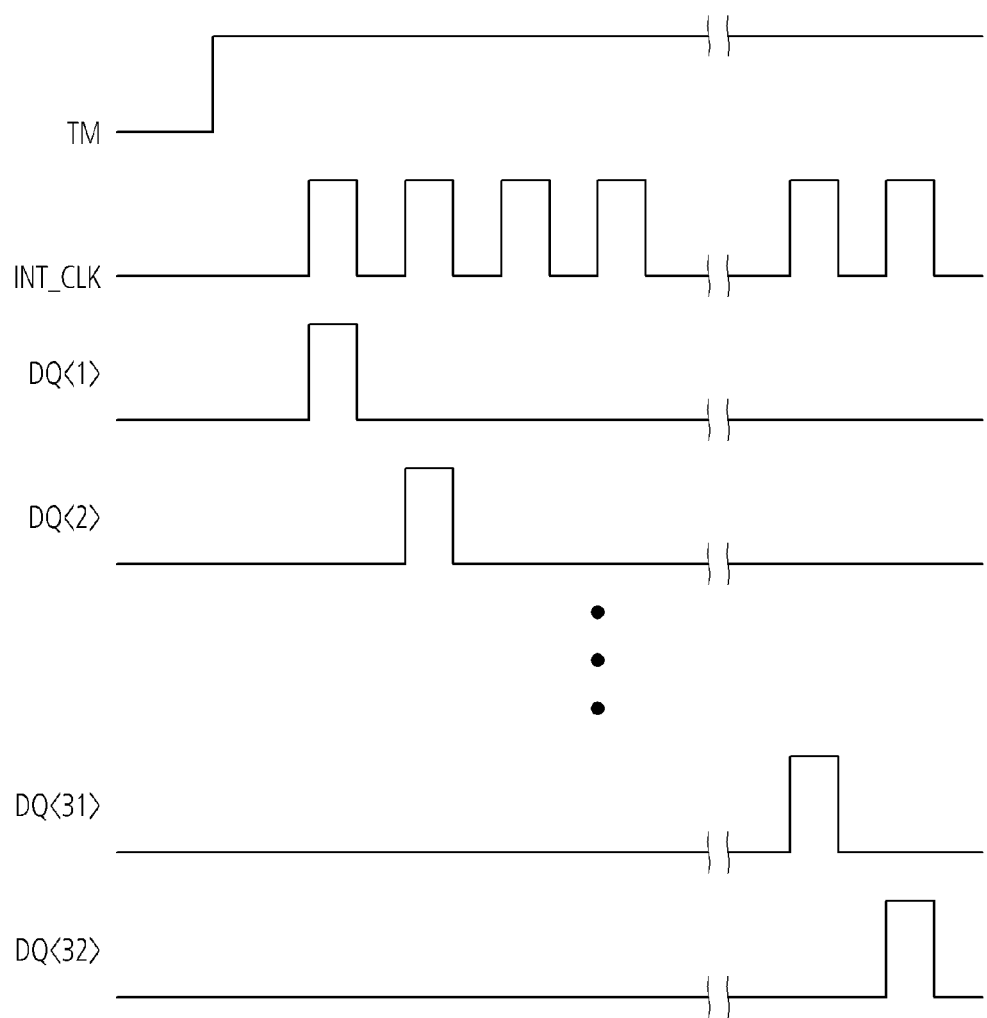
FIG. 7 is a timing diagram showing signals of DQ pads in accordance with an embodiment of the present invention.

FIG. 7 is a timing diagram showing signals of DQ pads in accordance with an embodiment of the present invention.

Referring to FIG. 7, the signals of the first to thirty-second DQ pads DQ<1:32> are sequentially enabled to a logic high level from a time when the internal clock INT_CLK is inputted as periodic pulses after the test mode is entered.

Figure 8:
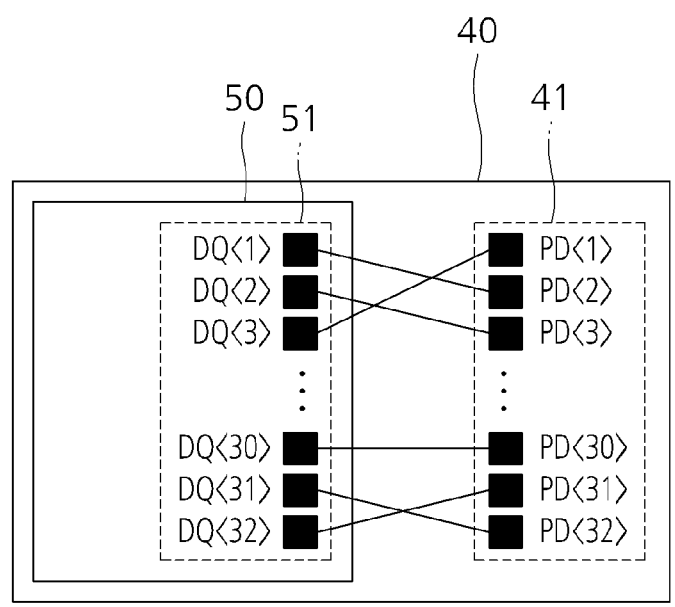
FIG. 8 is a diagram showing the connection configurations between the DQ pads of the semiconductor memory device in accordance with an embodiment of the present invention and the input/output pins of a system-in package.

FIG. 8 is a diagram showing the connection configurations between the DQ pads of the semiconductor memory device in accordance with an embodiment of the present invention and the input/output pins of the system-in package.

Referring to FIG. 8, first to thirty-second DQ pads DQ<1:32> of a DQ pad unit 51 of a semiconductor memory device 50 are connected with first to thirty-second pads PD<1:32> of a package pad unit 41 which are connected with input/output pins (not shown) of a system-in package 40, through bonding wires. Since the signals of the DQ pads DQ<1:32> are outputted by being sequentially enabled during a period of a test mode as mentioned above, the connection configurations between the input/output pins of the system-in package 40 and the DQ pads DQ<1:32> of the semiconductor memory device 50 may be determined by sensing the levels of the input/output pins of the system-in package 40.

The connection configurations between the DQ pads of the semiconductor memory device and the input/output pins of the system-in package will be described below with reference to FIGS. 1 to 8 by being divided into the case in which the test mode is entered and the case in which the test mode is exited.

First, when the test mode is entered, the logic stage 101 of the clock control signal generating section 100 performs the ANDing operation on the read command READ and the external clock CLK and outputs the output signal of the logic high level. The driving stage 102 pull-down drives the node nd10 in response to the output signal of the logic stage 101. The latch stage 104 latches the logic low level of the node nd10 and generates the clock control signal CLK_CON to the logic high level. The clock generating section 110 performs the ANDing operation on the test mode signal TM with the logic high level, the clock control signal CLK_CON and the external clock CLK and generates the internal clock INT_CLK including periodic pulses.

The first to fifth counters 201 to 205 of the counting signal generation unit 200 perform counting operations in response to the internal clock INT_CLK until all bits of the first to fifth counting signals CNT<1:5> are changed from logic low levels to logic high levels. The decoder 210 decodes the first to fifth counting signals CNT<1:5> and generates the first to thirty-second decoding signals DEC<1:32> which are sequentially enabled.

The first to thirty-second buffers 221 to 252 of the buffer unit 220 buffer the first to thirty-second decoding signals DEC<1:32>, generates the first to thirty-second DQ information signals DQ_MAP<1:32> which are sequentially enabled, and outputs the first to thirty-second DQ information signals DQ_MAP<1:32> to the node nd30.

The input/output control signal generation unit 300 of the data output block 30 receives the output enable signal OUT_EN and the external clock CLK and generates the first to thirty-second input control signals PIN<1:32> and the first to thirty-second output control signals POUT<1:32>, and the pipe latch unit 310 does not output the output data DOUT<1:32> to the node nd30 in response to the test mode signal TM with the logic high level.

The output driver 320 outputs the first to thirty-second DQ information signals DQ_MAP<1:32> inputted to the node nd30, to the first to thirty-second DQ pads DQ<1:32> of the DQ pad unit 330.

Here, the signals of the first to thirty-second DQ pads DQ<1:32>, which are sequentially enabled and outputted from the semiconductor memory device 50, are inputted to the input/output pins which are connected with the first to thirty-second pads PD<1:32> of the system-in package 40. Therefore, by observing the first to thirty-second pads PD<1:32> of the system-in package 40, the connection configurations between the input/output pins of the system-in package 40 and the DQ pads DQ<1:32> of the semiconductor memory device 50 can be determined.

Next, when the test mode is exited, the clock generating section 110 of the internal clock generation unit 10 disables the internal clock INT_CLK to the logic low level in response to the test mode signal TM with a logic low level.

The counting signal generation unit 200 of the DQ information signal generation block 20 does not count the first to fifth counting signals CNT<1:5>, and the decoder 210 does not enable the first to thirty-second decoding signals DEC<1:32>. Also, the buffer unit 220 does not buffer the first to thirty-second decoding signals DEC<1:32> in response to the test mode signal TM with the logic low level and does not output the first to thirty-second DQ information signals DQ_MAP<1:32> to the node nd30.

The input/output control signal generation unit 300 of the data output block 30 receives the output enable signal OUT_EN and the external clock CLK and generates the first to thirty-second input control signals PIN<1:32> and the first to thirty-second output control signals POUT<1:32>. The pipe latch unit 310 latches the data of memory cells in response to the test mode signal TM with the logic low level and outputs the output data DOUT<1:32> to the node nd30.

The output driver 320 outputs the first to thirty-second output data DOUT<1:32> inputted to the node nd30, to the first to thirty-second DQ pads DQ<1:32> of the DQ pad unit 330.

Because the first to thirty-second DQ pads DQ<1:32> are connected with the input/output pins of the system-in package 40, the first to thirty-second output data DOUT<1:32> are outputted to an outside.

As is apparent from the above descriptions, in the system-in package including a semiconductor memory device and the method for determining input/output pins of a system-in package according to the embodiments of the present invention, since preset levels are sequentially outputted to input/output pins of a system-in package during a period of a test mode, the connection configurations between the DQ pads of a semiconductor memory device and the input/output pins of the system-in package can be determined, and thus a test and a failure analysis of the system-in package can be easily performed.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A semiconductor memory device comprising:
   a logic stage configured to perform an ANDing operation on a read command and a external clock and output an output signal;
   a driving stage configured to drive a first node in response to the output signal of the logic stage;
   a latch stage configured to latch a signal of the first node and output a clock control signal;
   a reset stage configured to pull-up drive the first node in response to a reset signal;
   a clock generating section configured to buffer the external clock during a period when the clock control signal is enabled in response to a test mode signal and generate an internal clock;
   a DQ information signal generation block configured to generate DQ information signals which are sequentially enabled, in response to the internal clock; and
   a data output block configured to output the DQ information signals to DQ pads during a period of the test mode,
   wherein the internal clock is generated as period pulses at a time when the read command is inputted after the test mode is entered.

2. The semiconductor memory device according to claim 1, wherein the clock control signal generating section further comprises:
   a reset stage configured to pull-up drive the first node in response to a reset signal.

3. The semiconductor memory device according to claim 2, wherein the reset signal is a signal which is enabled after a power-up period in which a power supply voltage used by the semiconductor memory device is set to a predetermined level.

4. The semiconductor memory device according to claim 3, wherein the DQ information signal generation block comprises:
   a counting signal generation unit configured to generate first and second counting signals which are counted in response to the internal clock and the reset signal;
   a decoder configured to decode the first and second counting signals and generate first to fourth decoding signals; and
   a buffer unit configured to output first to fourth DQ information signals which are acquired by buffering the first to fourth decoding signals in response to the test mode signal, to a second node.

5. The semiconductor memory device according to claim 4, wherein the counting signal generation unit comprises:
   a first counter configured to count the first counting signal in response to the internal clock; and
   a second counter configured to count the second counting signal in response to the first counting signal.

6. The semiconductor memory device according to claim 4, wherein the buffer unit comprises:
   a first buffer configured to buffer the first decoding signal in response to the test mode signal and generate the first DQ information signal;
   a second buffer configured to buffer the second decoding signal in response to the test mode signal and generate the second DQ information signal;
   a third buffer configured to buffer the third decoding signal in response to the test mode signal and generate the third DQ information signal; and
   a fourth buffer configured to buffer the fourth decoding signal in response to the test mode signal and generate the fourth DQ information signal.

7. The semiconductor memory device according to claim 4, wherein the data output block comprises:
   an input/output control signal generation unit configured to generate input control signals and output control signals in response to an output enable signal and the external clock;
   a pipe latch unit configured to latch data of memory cells in response to the input control signals when the test mode is exited, and output the latched data to the second node as output data in response to the output control signals; and
   an output unit configured to buffer signals of the second node and output the buffered signals to the DQ pads.

8. The semiconductor memory device according to claim 7, wherein the output enable signal is a signal which is enabled when a read operation is entered after the read command is inputted.

9. The semiconductor memory device according to claim 7, wherein the data output block further comprises:
   a DQ pad unit having the DQ pads which receive output signals of the output unit and output the received signals to an outside.

10. The semiconductor memory device according to claim 1, wherein the driving stage pull-up drives the first node in response to a burst length end signal which is enabled at a time when data are outputted in the read operation period.

11. A system-in package comprising:
    a logic stage configured to perform an ANDing operation on a read command and a external clock and output an output signal;
    a driving stage configured to drive a first node in response to the output signal of the logic stage;
    a latch stage configured to latch a signal of the first node and output a clock control signal;
    a reset stage configured to pull-up drive the first node in response to a reset signal;
    a clock generating section configured to buffer the external clock during period when the clock control signal is enabled in response to a test mode signal and generate an internal clock;
    a DQ information signal generation block configured to generate DQ information signals which are sequentially enabled during a period of a the test mode;
    a data output block configured to output the DQ information signals to DQ pads during a period of the test mode; and
    a package pad unit connected with the DQ pads,
    wherein the internal clock is generated as period pulses at a time when the read command is inputted after the test mode is entered.

12. The system-in package according to claim 11, wherein the clock control signal generating section further comprises:
    a reset stage configured to pull-up drive the first node in response to a reset signal.

13. The system-in package according to claim 12, wherein the reset signal is a signal which is enabled after a power-up period in which a power supply voltage used by the semiconductor memory device is set to a predetermined level.

14. The system-in package according to claim 13, wherein the DQ information signal generation block comprises:
  a counting signal generation unit configured to generate first and second counting signals which are counted in response to the internal clock and the reset signal;
  a decoder configured to decode the first and second counting signals and generate first to fourth decoding signals; and
  a buffer unit configured to output first to fourth DQ information signals which are acquired by buffering the first to fourth decoding signals in response to the test mode signal, to a second node.

15. The system-in package according to claim 14, wherein the counting signal generation unit comprises:
  a first counter configured to count the first counting signal in response to the internal clock; and
  a second counter configured to count the second counting signal in response to the first counting signal.

16. The system-in package according to claim 14, wherein the buffer unit comprises:
  a first buffer configured to buffer the first decoding signal in response to the test mode signal and generate the first DQ information signal;
  a second buffer configured to buffer the second decoding signal in response to the test mode signal and generate the second DQ information signal;
  a third buffer configured to buffer the third decoding signal in response to the test mode signal and generate the third DQ information signal; and
  a fourth buffer configured to buffer the fourth decoding signal in response to the test mode signal and generate the fourth DQ information signal.

17. The system-in package according to claim 14, wherein the data output block comprises:
  an input/output control signal generation unit configured to generate input control signals and output control signals in response to an output enable signal and the external clock;
  a pipe latch unit configured to latch data of memory cells in response to the input control signals when the test mode is exited, and output the latched data to the second node as output data in response to the output control signals; and
  an output unit configured to buffer signals of the second node and output the buffered signals to the DQ pads.

18. The system-in package according to claim 17, wherein the output enable signal is a signal which is enabled when a read operation is entered after the read command is inputted.

19. The system-in package according to claim 17, wherein the data output block further comprises:
  a DQ pad unit having the DQ pads which receive output signals of the output unit and output the received signals to an outside.

20. The system-in package according to claim 11, wherein the driving stage pull-up drives the first node in response to a burst length end signal which is enabled at a time when data are outputted in the read operation period.

21. A method for determining input/output pins of a system-in package, comprising:
  generating an internal dock which includes periodic pulses, in response to a test mode signal;
  generating DQ information signals which are sequentially enabled, in response to the internal clock; and
  outputting the DQ information signals to input/output pins of a system-in package through DQ pads,
  wherein the internal clock is generated as period pulses at a time when a read command is inputted after a test mode is entered, and the internal clock is disabled in response to a burst length end signal which is enabled at a time when data are outputted by performing a read operation after the read command is in inputted.

22. The method according to claim 21, wherein the outputting of the DQ information signals comprises:
  outputting output data outputted from memory cells to the DQ pads when the test mode is exited.

* * * * *